US011029606B2

(12) United States Patent
Prochnau et al.

(10) Patent No.: US 11,029,606 B2
(45) Date of Patent: Jun. 8, 2021

(54) OPTICAL ELEMENT FOR THE BEAM GUIDANCE OF IMAGING LIGHT IN PROJECTION LITHOGRAPHY

(71) Applicant: Carl Zeiss SMT GmbH, Oberkochen (DE)

(72) Inventors: Jens Prochnau, Oberkochen (DE); Dirk Schaffer, Jena (DE); Roman Orlik, Katlenburg-Lindau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/735,883

(22) Filed: Jan. 7, 2020

(65) Prior Publication Data

US 2020/0150544 A1 May 14, 2020

Related U.S. Application Data

(63) Continuation of application No. PCT/EP2018/068551, filed on Jul. 9, 2018.

(30) Foreign Application Priority Data

Jul. 26, 2017 (DE) .......................... 102017212869.0
Jan. 8, 2018 (DE) .......................... 102018200152.9

(51) Int. Cl.
*G03F 7/20* (2006.01)
*G02B 7/182* (2021.01)
(52) U.S. Cl.
CPC ......... *G03F 7/70316* (2013.01); *G02B 7/182* (2013.01); *G03F 7/7015* (2013.01)

(58) Field of Classification Search
CPC ............ G03F 7/70316; G03F 7/70141; G03F 7/7015; G03F 7/70258; G03F 7/70825; G03F 7/70233; G03F 7/702; G02B 7/182; G02B 7/00; G02B 7/185
See application file for complete search history.

(56) References Cited

U.S. PATENT DOCUMENTS 1,000,718 A1    6/2018  Prochnau et al.
2007/0058269 A1 3/2007  Mann et al.
(Continued)

FOREIGN PATENT DOCUMENTS

DE   10 2010 029 050 A1   3/2011
DE   10 2012 214 214 A1   8/2013
DE   10 2013 214 989 A1   8/2014
(Continued)

OTHER PUBLICATIONS

German Examination Report, with translation thereof, for corresponding DE Appl No. 10 2017 212 869.0, dated Mar. 9, 2018.
(Continued)

*Primary Examiner* — Steven Whitesell Gordon
(74) *Attorney, Agent, or Firm* — Fish & Richardson P.C.

(57) ABSTRACT

An optical element is configured to guide imaging light in projection lithography. The optical element has a main body and at least one optical surface carried by the main body. At least one compensation weight element, which is attached to the main body, serves for a weight compensation of a figure deformation of the optical surface caused by gravity. This results in an optical element with a small figure deformation at the use location.

22 Claims, 9 Drawing Sheets

(56) References Cited

U.S. PATENT DOCUMENTS

2013/0272876 A1* 10/2013 Falkenberg ............. F03D 80/00
                                                          416/1
2015/0055112 A1*  2/2015 Schaffer ................. G02B 7/182
                                                          355/67

FOREIGN PATENT DOCUMENTS

| DE | 10 2014 218 969 A1 | 4/2016 |
| WO | WO 2009/053023 A2 | 4/2009 |
| WO | WO 2012/013559 A1 | 2/2012 |
| WO | WO 2016/045778 A1 | 3/2016 |
| WO | WO 2016/166080 A1 | 10/2016 |
| WO | WO 2016/188934 A1 | 12/2016 |

OTHER PUBLICATIONS

International Search Report and Written Opinion for corresponding PCT Appl No. PCT/EP2018/068551, dated Oct. 23, 2018.

* cited by examiner

OPTICAL ELEMENT FOR THE BEAM GUIDANCE OF IMAGING LIGHT IN PROJECTION LITHOGRAPHY

CROSS-REFERENCE TO RELATED APPLICATIONS

The present application is a continuation of, and claims benefit under 35 USC 120 to, international application PCT/EP2018/068551, filed Jul. 9, 2018, which claims benefit under 35 USC 119 of German Application Nos. 10 2017 212 869.0, filed Jul. 26, 2017, and 10 2018 200 152.9, filed Jan. 8, 2018. The entire disclosure of these applications are incorporated by reference herein.

FIELD

The disclosure relates to an optical element for the beam guidance of imaging light in projection lithography. Further, the disclosure relates to a method for producing such an adjusted optical element, an imaging optical unit including at least one such optical element, an optical system including such an imaging optical unit, a projection exposure apparatus including such an optical system, a method for producing a microstructured or nanostructured component via such a projection exposure apparatus, and a microstructured or nanostructured component produced by the method.

BACKGROUND

An optical element for the beam guidance of imaging light in projection lithography is known from DE 10 2013 214 989 A1. Imaging optical units are known from WO 2016/188934 A1 and WO 2016/166080 A1.

SUMMARY

The disclosure seeks to provide an optical element with a desirably small figure deformation at the use location.

In one aspect, the disclosure provides an optical element for the beam guidance of imaging light in projection lithography. The optical element includes a main body and at least one optical surface carried by the main body. The optical element also includes at least one compensation weight element, which is attached to the main body, for a weight compensation of a figure deformation of the optical surface caused by gravity.

According to the disclosure, it was recognized that the demands on the figure accuracy, i.e., on the correspondence of the form of optical surfaces of the optical elements to the beam guidance of imaging light are so high in projection lithography that a gravitational force, which acts directly or indirectly onto the optical surface, in particular the exact magnitude of the gravitational force at the use location of the projection exposure apparatus, the constituent part of which is the considered optical element, plays a role. It was therefore recognized that it is desirable to take account of a figure deformation of the optical surface caused by gravity, which is dependent on the use location in particular. At least one compensation weight element of the optical element ensures an appropriate weight compensation, and so it is possible to compensate effects on the optical surface caused by gravity, in particular force differences caused by gravity and the influence thereof on the figure between a mirror production location on the one hand and a mirror use location on the other hand. A further example of a figure deformation caused by gravity, which can be compensated with the aid of the at least one compensation weight, is a deformation of the optical surface on account of force transmission, caused by gravity, between the main body of the optical element and a bearing of the optical element, for example in a holding frame.

In some embodiments, the optical element is embodied as a mirror, wherein the at least one compensation weight element is attached to the main body at a mirror rear side that faces away from the optical surface and/or at the edge of the optical element. Such a configuration was found to be particularly suitable. The compensation weight elements can be attached to the mirror rear side, without these disturbing the optical surface. An alternative or in addition thereto, the at least one weight compensation element can be attached to the edge of the optical element, i.e., for example, to the edge of the mirror. Such an attachment of the at least one compensation weight element at the edge of the optical element also can be implemented if the optical element is not embodied as a mirror but as a lens element, for example. Attaching the at least one compensation weight element to the edge of the optical element can be brought about at the edge of a main body of the optical element, for example at a lateral wall of the main body. Attaching the at least one compensation weight element to the optical element, in particular to the edge of the optical element, can be brought about with the aid of a magnetic fixation. At least one magnet used for this fixation can be a constituent part of the optical element and/or a constituent part of the respective compensation weight element.

Attaching at least one compensation weight element in the region of the center-of-mass axis can ensure an effect of a compensation weight element attached in this manner that is as symmetrical as possible. Then, attaching exactly one compensation weight element suffices in many cases. In principle, it is also possible to attach a plurality of compensation weight elements to the main body in the region of a center-of-mass axis of the optical element. By way of example, attaching a plurality of compensation weight elements like that in the region of the center-of-mass axis is suitable in situations in which the center-of-mass axis itself is not accessible for the attachment of a compensation weight element, for example if a passage opening in the main body of the optical element is present there. In such a case, a compensation weight element or a plurality of compensation weight elements can be arranged in the region of an edge of such a passage opening such that, to a good approximation, the weight effect of the at least one compensation weight element on the center-of-mass axis arises. As an alternative or in addition to the arrangement variants explained above, at least one compensation weight element can be attached radially between the center-of-mass axis of the optical element and an outer edge region of the optical element. At least two such radially arranged compensation weight elements, in particular arranged radially on the same radius between the center-of-mass axis and the outer edge region of the optical element, are also possible.

In some embodiments, the main body, on the circumferential side, is borne by way of a plurality of bearing sites in a bearing receptacle of a holding frame of the optical element, wherein at least one compensation weight element is arranged between two bearing sites that are adjacent to one another in the circumferential direction. In such a configuration, additional degrees of freedom that deviate from a rotational symmetry can be used in the weight compensation of a figure deformation of the optical surface caused by gravity. Such compensation weight elements attached on the circumferential side can also be used without a compensation weight element in the region of the center-of-mass axis of the optical element. A plurality of compensation weight elements also can be arranged between two bearing sites that are adjacent to one another in the circumferential direction.

In some embodiments, respectively one compensation weight element is arranged between all bearing sites that are adjacent to one another in the circumferential direction. Such a configuration was found to be particularly expedient.

In some embodiments, at least one compensation weight element is connected to the main body in an interlocking and/or integrally bonded manner. In certain embodiments, a compensation weight of the compensation weight element is connected to the main body by way of a connecting lever in such a way that a direction of a gravitational force of the compensation weight, proceeding from the center of mass thereof, extends at a distance from a connection region by which the connecting lever is connected to the main body. The connecting lever can be adjustable in terms of its length and/or its direction. In some embodiments, the compensation weight element is connected to the main body by way of an additional element. Such attachment variants can be used alternatively or in combination with one another, have proven to be particularly suitable for a firstly secure and secondly little complicated connection of the respective compensation weight element to the main body. By way of example, such a connection can be obtained by screwing or clipping the compensation weight element to the main body. A force-fit connection and/or a force-fit connection contribution of the compensation weight element at the main body is also possible.

As noted, in some embodiments at least one compensation weight element is connected to the main body in an interlocking and/or integrally bonded manner a compensation weight of the compensation weight element is connected to the main body by way of a connecting lever in such a way that a direction of a gravitational force of the compensation weight, proceeding from the center of mass thereof, extends at a distance from a connection region by which the connecting lever is connected to the main body. Such a configuration facilitates an introduction of torque from the compensation weight element into the main body, which can be used for a targeted influence on the figure of the optical surface of the optical element.

As noted, the connecting lever can be adjustable in terms of its length and/or its direction. Such a configuration facilitates an adjustable prescription of an absolute value and/or a direction of the torque introduction via the torque compensation weight element.

As noted, in some embodiments the compensation weight element is connected to the main body by way of an additional element. Such an additional element can be an interface plate. Such a connection of the compensation weight element to the main body by way of the additional element can be brought about in an integrally bonded manner, for example by way of at least one adhesive layer, and/or in a magnetic manner.

In some embodiments, the disclosure provides a method for producing an adjusted optical element as disclosed herein The method includes the following steps: producing a blank of the optical element taking account of a negative deformation allowance; transporting the blank to the use location of an apparatus for projection lithography; and attaching at least one compensation weight element to the main body of the optical element taking account of the gravitational acceleration at the use location for weight compensation of the figure deformation of the optical surface caused by gravity. The advantages of such a production method correspond to those which were already explained above with reference to the optical element. Attaching the at least one compensation weight element can be carried out before or after moving the blank to the use location of the apparatus for projection lithography. An adjustment step for the optical element within the respective assembly still can follow the compensation weight attachment step. The optical element can be a constituent part of a projection optical unit and/or a constituent part of an illumination optical unit of the projection exposure apparatus.

The disclosure also includes a set of various compensation weight elements, selected ones of which are attachable to the main body of the optical element for weight compensation purposes. The compensation weight elements of this set of compensation weight elements can be ring-shaped or disc-shaped. The compensation weight elements of the set can have different ring or disc diameters. The compensation weight elements of the set can have the same ring or disc thicknesses. Should the compensation weight elements be ring-shaped or disc-shaped and, in terms of the axis of rotational symmetry, be attachable in centerd fashion to the main body of the optical element, what emerges if the compensation weight elements differ only in terms of diameter but not in terms of thickness is that the center of mass of the compensation weight element respectively attached to the main body always lies at the same location relative to the main body, independently of the diameter of the compensation weight element. Then, torque contributions that occur in uncontrolled fashion when changing between compensation weight elements with different diameters are avoided.

The compensation weight elements of the set can have a homogeneous density such that the mass of the compensation weight element depends only on the volume thereof.

The advantages of related imaging optical units, optical systems, projection exposure apparatuses, production methods for microstructured or nanostructured components, and microstructured or nanostructured components made by such methods correspond to those that have already been explained above with reference to the optical element according to the disclosure and the production method according to the disclosure for the adjusted optical element. In particular, a semiconductor component, for example a memory chip, may be produced using the projection exposure apparatus.

The light source can be an EUV light source. Alternatively, use can also be made of a DUV light source, that is to say, for example, a light source with a wavelength of 193 nm.

BRIEF DESCRIPTION OF THE DRAWINGS

Exemplary embodiments of the disclosure is explained in greater detail below with reference to the drawings, in which.

EXEMPLARY EMBODIMENTS OF THE DISCLOSURE

Figure 1:
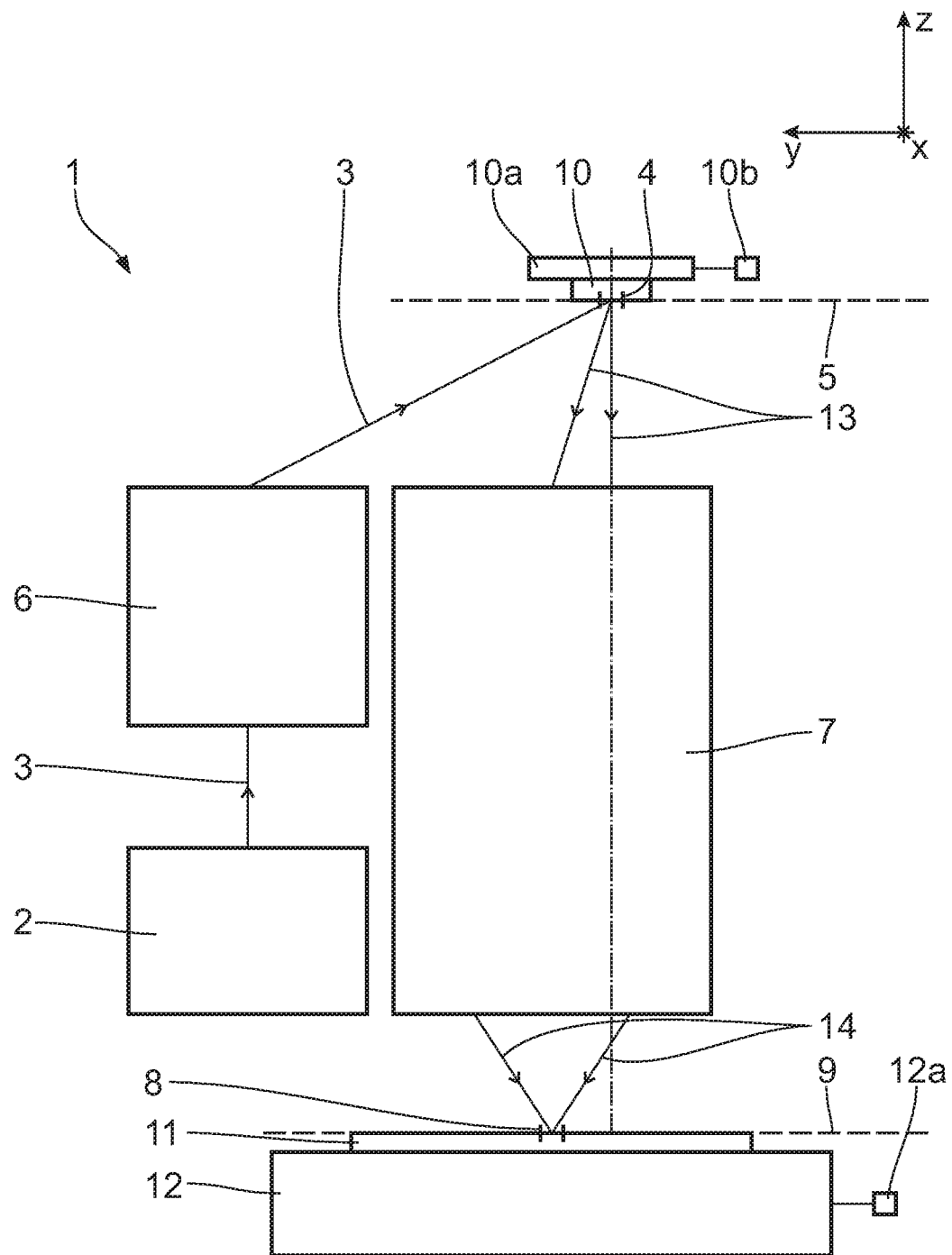
FIG. 1 schematically shows a projection exposure apparatus for EUV microlithography.

A microlithographic projection exposure apparatus 1 has a light source 2 for illumination light or imaging light 3. The light source 2 is an EUV light source, which produces light in a wavelength range of e.g. between 5 nm and 30 nm, in particular between 5 nm and 15 nm. The light source 2 can be a plasma-based light source (laser-produced plasma (LPP), gas-discharge produced plasma (GDP)) or else a synchrotron-based light source, for example a free electron laser (FEL). In particular, the light source 2 may be a light source with a wavelength of 13.5 nm or a light source with a wavelength of 6.9 nm. Other EUV wavelengths are also possible. In general, even arbitrary wavelengths are possible for the illumination light 3 guided in the projection exposure apparatus 1, for example visible wavelengths or else other wavelengths which may find use in microlithography (for example, DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs towards the left, and the z-direction runs upward.

In the projection optical unit 7, the object field 4 and the image field 8 have a bent or curved embodiment and, in particular, an embodiment shaped like a partial ring. A radius of curvature of this field curvature can be 81 mm on the image side. A corresponding ring field radius of the image field is defined in WO 2009/053023 A2. A basic form of a boundary contour of the object field 4 or of the image field 8 has a corresponding bend. Alternatively, it is possible to embody the object field 4 and the image field 8 with a rectangular shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

In an exemplary embodiment of the projection optical unit 7, an x-dimension of the image field of 26 mm and a y-dimension of the image field 8 of 1.2 mm are present.

Accordingly, the object field 4 is spanned by the first Cartesian object field coordinate x and the second Cartesian object field coordinate y. The third Cartesian coordinate z, which is perpendicular to these two object field coordinates x and y, is also referred to as normal coordinate below.

Figure 2:
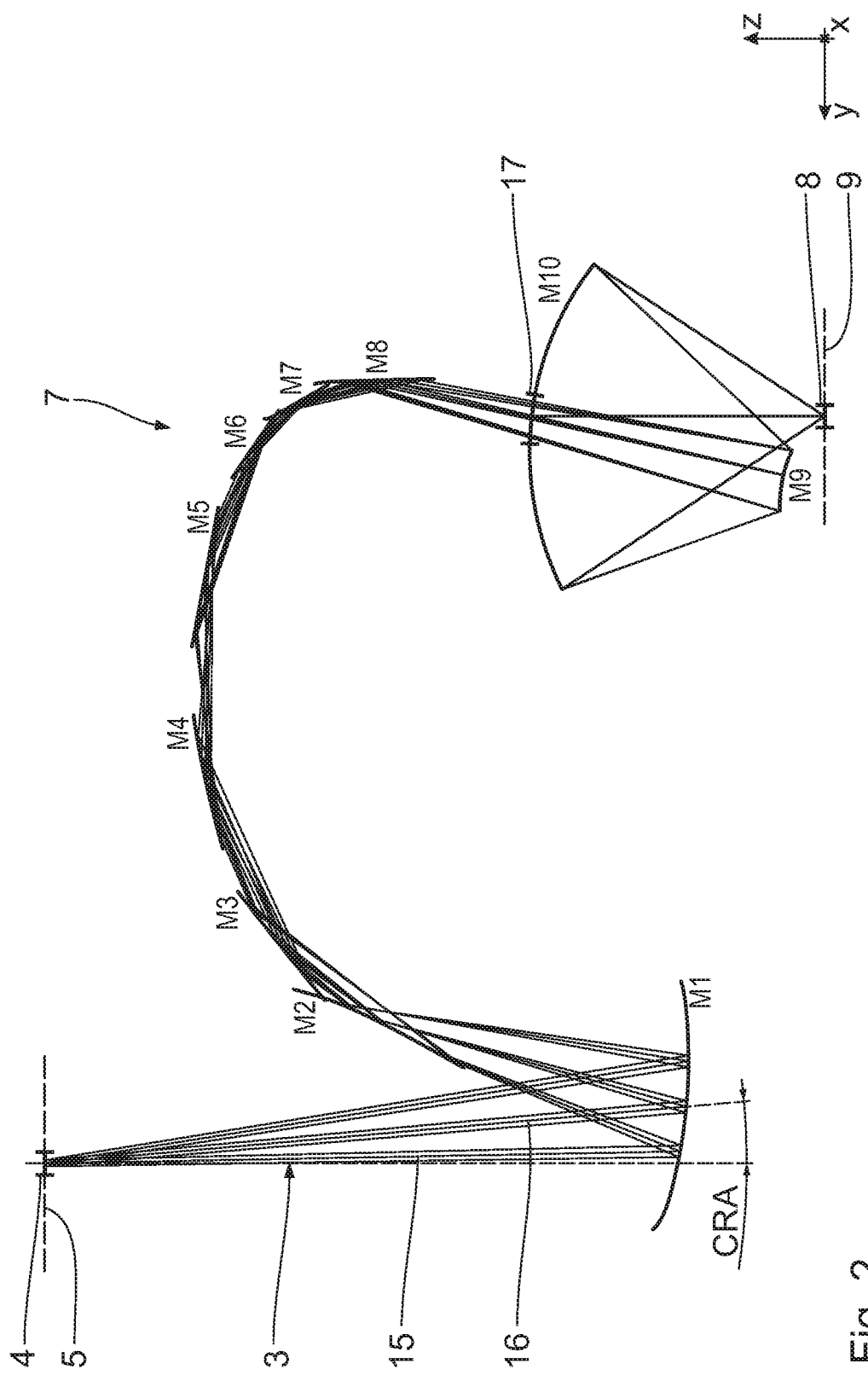
FIG. 2 shows, in a meridional section, an embodiment of an imaging optical unit which can be used as a projection lens in the projection exposure apparatus according to FIG. 1, wherein an imaging beam path for chief rays and for an upper coma ray and a lower coma ray of three selected field points is depicted.
Figure 3:
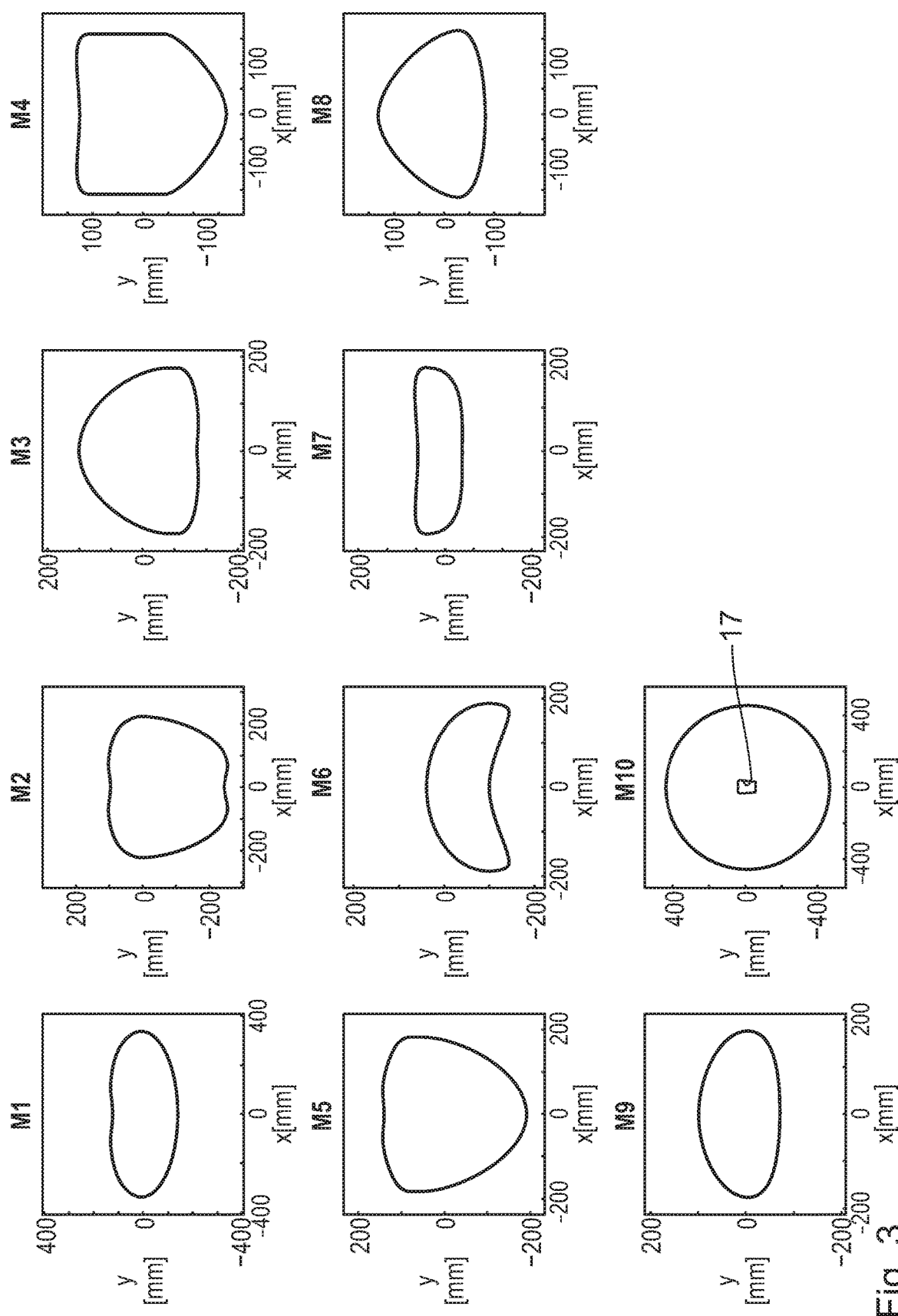
FIG. 3 shows marginal contours of used mirror surfaces of mirrors of the imaging optical unit according to FIG. 2.

The exemplary embodiment depicted in FIG. 2 can be used for the projection optical unit 7. The optical design of the projection optical unit 7 according to FIGS. 2 and 3 is known from WO 2016/188934 A1, the content of which is referred to in its entirety.

In the embodiment of the projection optical unit 7 according to FIG. 2, the image plane 9 is arranged parallel to the object plane 5. What is imaged in this case is a section of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

FIG. 2 shows the optical design of the projection optical unit 7. FIG. 2 shows the projection optical unit 7 in a meridional section, i.e. the beam path of the imaging light 3 in the yz-plane. The projection optical unit 7 according to FIG. 2 has a total of ten mirrors, which are numbered consecutively by M1 to M10 in the order of the beam path of the individual rays 15, proceeding from the object field 4.

FIG. 2 depicts the beam path of in each case three individual rays 15 emanating from three object field points which are spaced apart from one another in the y-direction in FIG. 2. What are depicted are chief rays 16, i.e. individual rays 15 which pass through the center of a pupil in a pupil plane of the projection optical unit 7, and in each case an upper coma ray and a lower coma ray of these two object field points. Proceeding from the object field 4, the chief rays 16 include an angle CRA of 5.2° with a normal of the object plane 5.

The object plane 5 lies parallel to the image plane 9.

FIG. 2 depicts sections of the calculated reflection surfaces of the mirrors M1 to M10. A portion of these calculated reflection surfaces is used. Only this actually used region of the reflection surfaces, plus an overhang, is actually present in the real mirrors M1 to M10.

FIG. 3 shows this is actually used region of the reflection surfaces of the mirrors M1 to M10. The mirror M10 has a passage opening 17 for the passage of the imaging light 3 which is reflected from the antepenultimate mirror M8 towards the penultimate mirror M9. The mirror M10 is used in a reflective manner around the passage opening 17. None of the other mirrors M1 to M9 has passage openings and the mirrors are used in a reflective manner in a continuous region without gaps.

The mirrors M1 to M10 are embodied as free-form surfaces which cannot be described by a rotationally symmetric function. Other embodiments of the projection optical unit 7, in which at least one of the mirrors M1 to M10 is embodied as a rotationally symmetric asphere, are also possible. An asphere equation for such a rotationally symmetric asphere is known from DE 10 2010 029 050 A1. It is also possible for all mirrors M1 to M10 to be embodied as such aspheres.

A free-form surface can be described by the following free-form surface equation (equation 1):

$$Z = \frac{c_x x^2 + c_y y^2}{1 + \sqrt{1 - (1 + k_x)(c_x x)^2 - (1 + k_y)(c_y y)^2}} + \\ C_1 x + C_2 y + C_3 x^2 + C_4 xy + C_5 y^2 + C_6 x^3 + \ldots + \\ C_9 y^3 + C_{10} x^4 + \ldots + C_{12} x^2 y^2 + \ldots + C_{14} y^4 + C_{15} x^5 + \\ \ldots + C_{20} y^5 + C_{21} x^6 + \ldots + C_{24} x^3 y^3 + \ldots + C_{27} y^6 + \ldots \quad (1)$$

The following applies to the parameters of this equation (1):

Z is the sag of the free-form surface at the point x, y, where $x^2+y^2=r^2$. Here, r is the distance from the reference axis of the free-form equation (x=0; y=0).

In the free-form surface equation (1), $C_1, C_2, C_3, \ldots$ denote the coefficients of the free-form surface series expansion in powers of x and y.

In the case of a conical base area, $c_x$, $c_y$ is a constant corresponding to the vertex curvature of a corresponding asphere. Thus, $c_x=1/R_x$ and $c_y=1/R_y$ applies. Here, $k_x$ and $k_y$ each correspond to a conical constant of a corresponding asphere. Thus, equation (1) describes a biconical free-form surface.

An alternative possible free-form surface can be generated from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using for example polynomials or functions which have specific properties in respect of the continuity and the differentiability thereof. Examples for this are analytical functions.

The used reflection surfaces of the mirrors M1 to M10 are carried by main bodies.

The main body 18 can be manufactured from glass, from ceramics or from glass ceramics. The material of the main body 18 can be matched in such a way that its coefficient of thermal expansion at the selected operating temperature of the mirror M lies very close to the value of 0 and ideally is exactly 0. Zerodur® is an example of such a material.

Figure 4:
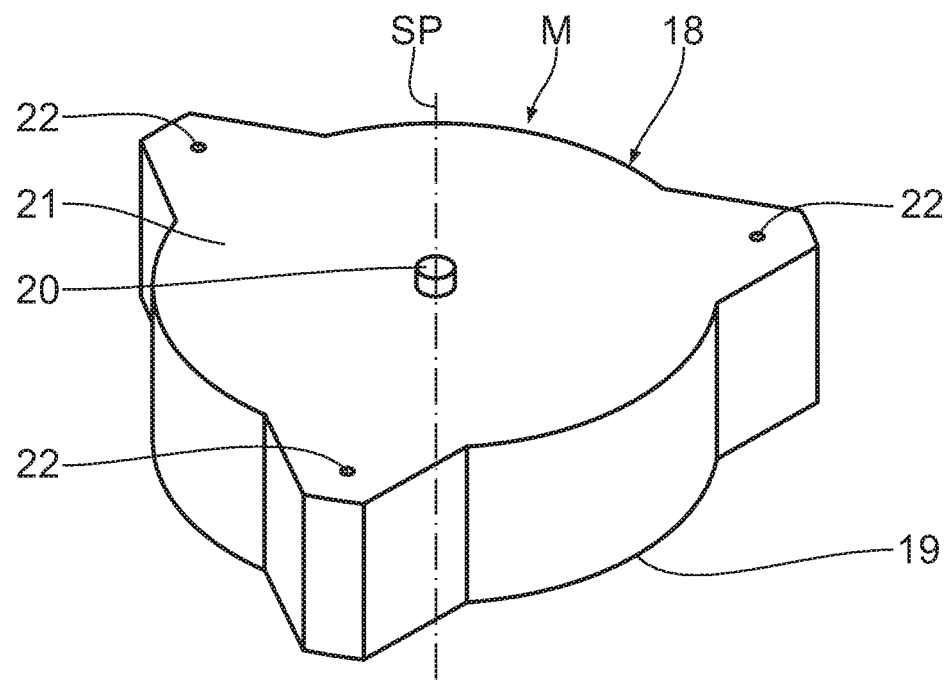
FIG. 4 shows, in a perspective view, the main body of a mirror of the imaging optical unit according to FIG. 2 with a compensation weight element attached to the main body for compensating the weight of a figure deformation of an optical surface of the mirror caused by gravity, wherein the compensation weight element is attached to the main body in the region of a center-of-mass axis of the mirror.

FIG. 4 shows a perspective view of such a main body 18 in an exemplary manner. Here, the viewing direction is from a mirror rear side, i.e., from a side facing away from the reflectively used mirror surface. The optical surface used for reflections is denoted by 19 in FIG. 4.

The mirror M shown in FIG. 4 can be any one of the mirrors M1 to M10 explained above.

A compensation weight element 20 is attached to the main body 18 in the embodiment of the mirror M according to FIG. 4. The compensation weight element serves to compensate the weight of a figure deformation of the optical surface caused by gravity. Thus, the compensation weight 20 serves to compensate figure errors of the optical surface 19, which result on account of the fact that the mirror M is produced at a production location at which the gravitational force on the mirror M differs from that at the use location of the mirror M where semiconductor components are produced using a projection exposure apparatus, of which the mirror M is a constituent part.

The compensation weight element 20 is attached to the rear side 21 of the main body 18. The compensation weight element 20 is attached to the main body 18 in the region of a center-of-mass axis SP of the mirror M that is indicated schematically in FIG. 4.

The compensation weight element 20 is connected to the main body 18 in interlocking fashion by way of an undercut catch that is not illustrated in any more detail. To this end, the main body 18 has a recess with an undercut, into which a section of the compensation weight element 20 that is complementary to the recess is latched or clipped, engaging behind this undercut. Alternatively, the compensation weight element 20 can also be connected to the main body 18 in an integrally bonded manner and/or by way of a screwed connection.

Any further embodiment that is not illustrated here, the compensation weight element 20 also can be connected to the main body 18 by way of an interposed interface plate. The interface plate, in turn, can be connected firstly to the compensation weight element 20 and secondly to the main body 18 in an interlocking or integrally bonded manner, as already explained above in conjunction with the connection of the compensation weight element 20 to the main body 18.

The main body 18 has a plurality of bearing sites 22. These are three bearing sites 22 in the illustrated exemplary embodiment. By way of these bearing sites 22, the main body 18 is borne in a bearing receptacle of the holding frame, not illustrated here, of the mirror M.

The following procedure is adopted when producing an adjusted optical element in the style of the mirror M according to FIG. 4:

First, a blank of the mirror M is produced, taking into account a negative deformation allowance at a production location. Here, the optical surface 19 is preformed in such a way that it only has the desired figure under the force of at least one compensation weight element in the style of the compensation weight element 20. Subsequently, the blank that is pre-manufactured in this way is moved to the use location of the projection exposure apparatus. There, at least one compensation weight element in the style of the compensation weight element 20 is attached to the main body 18 of the mirror M, taking account of the gravitational acceleration at the use location, for the purposes of compensating the weight of a figure deformation of the optical surface 19 caused by gravity. Provided that the gravitational acceleration at the use location is sufficiently well known, it is possible to interchange the two last steps of "moving the blank to the use location" and "attaching the at least one compensation weight element". Subsequently, the mirror is adjusted at its use location in the projection exposure apparatus.

In a variant of the mirror production method, a raw compensation weight element can be attached immediately to the main body of the optical element during the production of the blank of the optical element, the raw compensation weight element overcompensating the expected effect of the figure deformation of the optical surface caused by gravity. For the purposes of producing the adjusted optical element, the compensation weight element then can be made lighter in respect of its weight effect on the optical surface by removing part of the compensation weight element, for example by ablation, until the desired weight compensation effect for achieving the desired compensation of the figure deformation is achieved. This variant of the production method avoids subsequently attaching a discharge element to the already completed optical surface, which could lead to an unwanted figure deformation in its own right.

In an embodiment of the mirror M as an asymmetric mirror made of ceramics with a mass of 500 kg, a diameter of 90 cm and a thickness of 20cm, a theoretical fit deformation, caused by a gravitational acceleration variation of 0.1%, is approximately 350 pm. As a result of the weight compensation described above via a compensation weight element, this effect is reducible to approximately 13 pm. Thus, after compensation, less than 4% of the original figure deformation remain.

In general, it is possible to achieve a compensation of the figure deformation caused by gravity to a value of less than 10% of the original figure deformation caused by gravity.

Figure 5:
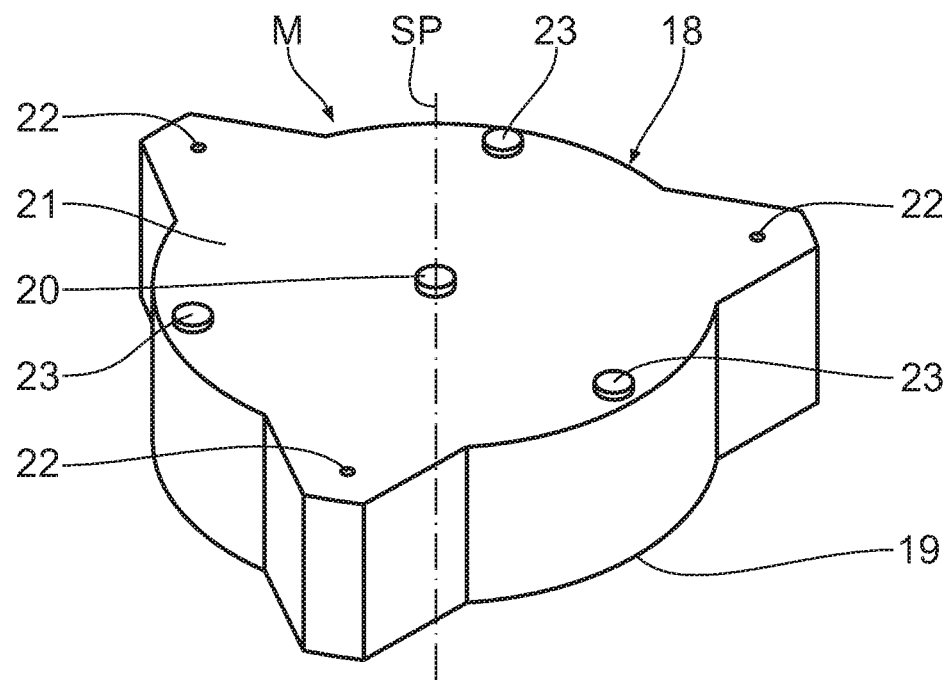
FIG. 5 shows, in an illustration similar to FIG. 3, a further embodiment of an arrangement of compensation weight elements, wherein, in addition to a compensation weight element according to FIG. 3, further compensation weight elements are attached between bearing sites of the main body that are respectively arranged adjacent to one another in the circumferential direction.

FIG. 5 shows a further embodiment of an optical element using the example of a mirror M with a weight-compensated figure deformation of the optical surface caused by gravity. Components and functions that were already explained above in the context of FIGS. 1 to 4, in particular in the context of FIG. 4, are denoted by the same reference signs and are not discussed in detail again.

In addition to the central compensation weight element 20 in the region of the center-of-mass axis SP, the main body 18 of the mirror M according to FIG. 5 has further compensation weight elements 23. One of these further compensation weight elements 23 is arranged in each case between two bearing sites 22 that are adjacent to one another in the circumferential direction about the center-of-mass axis SP. Additional degrees of freedom in the weight compensation of the figure deformation caused by gravity emerge with the aid of such an embodiment having a plurality of compensation weight elements 20, 23.

In a further, not illustrated embodiment of an arrangement of compensation weight elements that otherwise corresponds to the embodiment according to FIG. 5, the central compensation weight element 20 in the region of the center-of-mass axis SP is missing.

Figure 6:
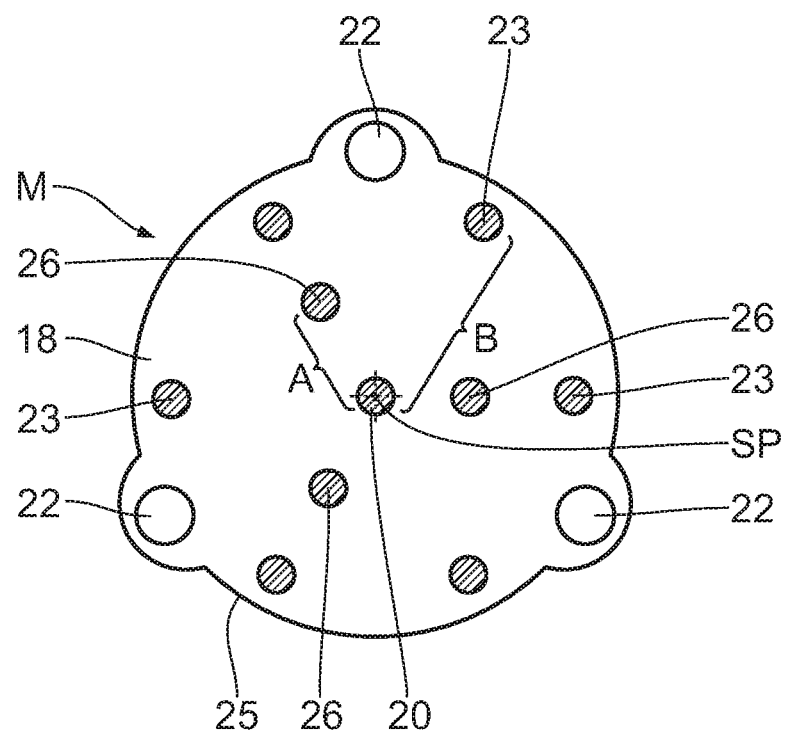
FIG. 6 shows a rear-side view of a main body of a mirror with a further arrangement of compensation weight elements.

FIG. 6 shows a rear-side view of the mirror M with a further arrangement variant of the compensation weight elements.

In the arrangement according to FIG. 6, a centrally arranged compensation weight element 20 in the style of the embodiments of FIGS. 4 and 5 is present. In the embodiment according to FIG. 6, two compensation weight elements 23 are present, in each case, between two bearing sites 22 that are adjacent to one another in the circumferential direction about the center-of-mass axis SP. Additionally, further compensation weight elements 26 are present radially between the center-of-mass axis SP and an outer edge region 25 of the mirror M, the further compensation weight elements having half the distance A or the radius value in relation to the central compensation weight element 20 when compared to the outer compensation weight elements 23 arranged on the circumference between the bearing sites 22. The distance between the central compensation weight element 20 and the outer compensation weight elements 23 arranged between adjacent bearing sites 22 is denoted by B in FIG. 6. Thus, the following applies in the embodiment according to FIG. 6: B=2A.

Other ratios B/A in the range of between 1.1 and 10 are also possible. The radial compensation weight elements 26 can all have the same distance A from the central compensation weight element 20. Alternatively, it is possible to provide different distances $A_1$, $A_2$, . . . between the radial compensation weight elements 26 and the central compensation weight element 20.

Overall, three radial compensation weight elements 26 and six circumferential compensation weight elements 23 are present in arrangement of the compensation weight elements according to FIG. 6 in addition to the central compensation weight element 20; i.e., there is a total of 10 compensation weight elements. By way of example, depending on the desired compensation of the figure deformation, the number of compensation weight elements can lie in the range of between 5 and 25.

Figure 7:
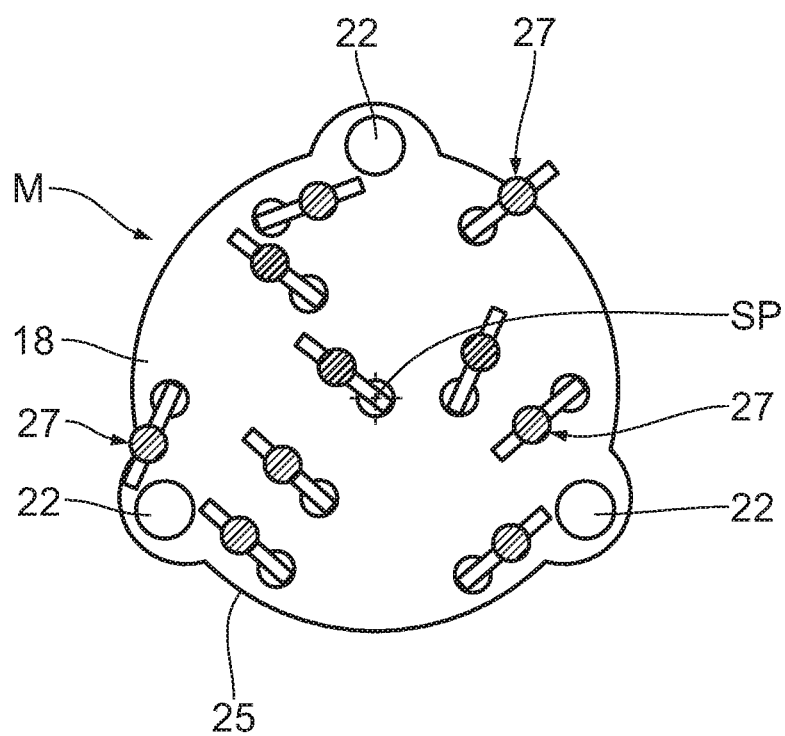
FIG. 7 shows, in an illustration similar to FIG. 6, an arrangement of compensation weight elements, comparable to FIG. 6, in each case embodied with a connecting lever for introducing torque.

While, in principle, having the same arrangement of the compensation weight elements as in FIG. 6, FIG. 7 shows a design of compensation weight elements 27 that is an alternative to the embodiment according to FIGS. 4 to 6, the compensation weight elements being designed as torque compensation weight elements. Thus, overall, ten such torque compensation weight elements 27 are present in FIG. 7 at the location of the compensation weight elements 20, 23 and 26 of the embodiment according to FIG. 6.

Figure 8:
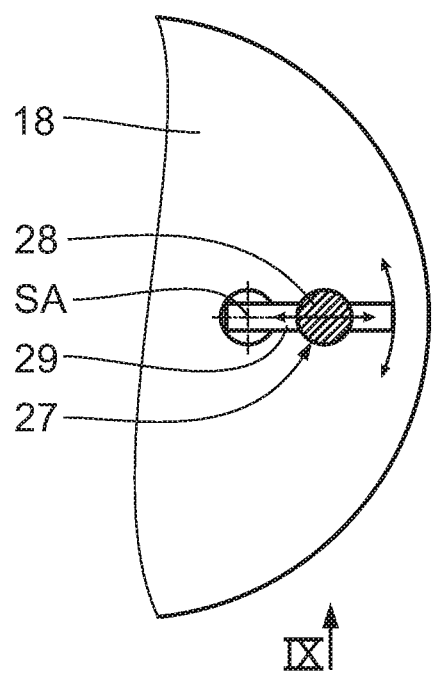
FIG. 8 shows, in a view similar to FIG. 7, one of the compensation weight elements in the style of those of FIG. 7, with an additional elucidation of mobilities of the compensation weight element along the connecting lever on the one hand and a pivotability of the connecting lever on the other hand.
Figure 9:
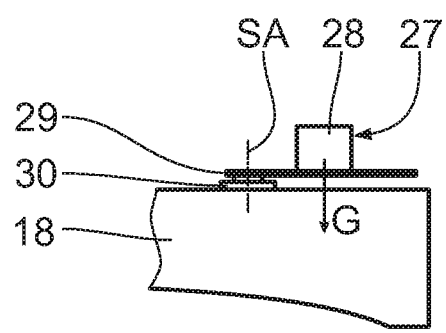
FIG. 9 shows a lateral view of the compensation weight element according to FIG. 8, as seen from the viewing direction IX in FIG. 8.

FIGS. 8 and 9 elucidate the design of the first embodiment of the torque compensation weight elements 27. These each have a compensation weight 28, which is connected to the main body 18 via a connecting lever 29 and an additional element 30 that is designed as an interface.

When the mirror M is oriented in such a way that the rear side thereof points upwards, a direction of the gravitational force G of the compensation weight 28 of the torque compensation weight element 27 extends, proceeding from the center of mass of the compensation weight 28, at a distance from a connection region via which the connecting lever 29 is connected to the main body 18, i.e., at a distance from the additional element (interface) 30. This results in a torque which the torque compensation weight element 27 introduces into the main body 18 of the mirror M. The introduction of torque can be used for a targeted change of the figure of the opposite optical surface 19 of the mirror that is used for reflection purposes.

In the torque compensation weight element 27, it is possible to predetermine both the magnitude of the introduced torque and also the direction thereof in an adjustable manner. In order to predetermine the magnitude of the introduced torque, the compensation weight 28 can be displaced along the connecting lever 29 relative to the latter, as indicated in FIG. 8 by a double-headed arrow in the longitudinal direction of the connecting lever 29.

An effective length of the connecting lever 29 and hence the absolute value of the introduced torque is set by way of the displacement of the compensation weight 28 along the connecting lever 29. This adjustment of the compensation weight 28 along the connecting lever 29 can be brought about continuously. By way of example, the compensation weight 28 can be affixed magnetically to the connecting lever 29.

A direction of the torque introduced into the main body 18 via the torque compensation weight element 27 can be predetermined by way of a pivot setting of the connecting lever 29 about a pivot axis SA, as indicated in FIG. 8 by a further double-headed arrow. Here, the additional element 30 can be embodied with a pivot bearing to the main body 18, the pivot bearing being fixable in a predetermined pivot position of the connecting lever 29 relative to the main body 18 such that the connecting lever 29 is fixed in this pivot position.

Figure 10:
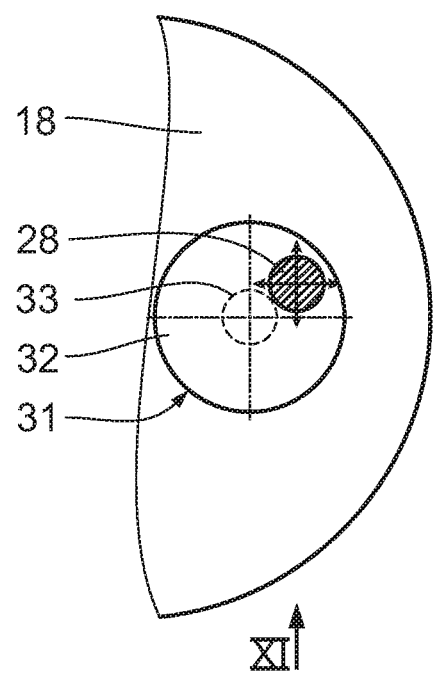
FIGS. 10 and 11 show, in illustrations similar to FIGS. 8 and 9, a further embodiment of a compensation weight element with a connecting lever embodied as a disc.
Figure 11:
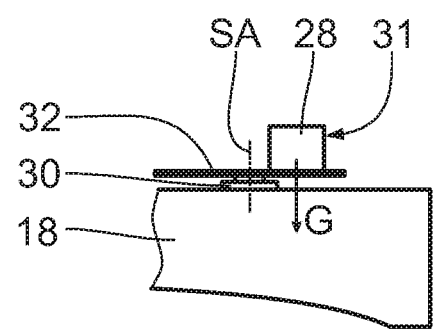

Below, a further embodiment of such torque compensation weight element 31 is described on the basis of FIGS. 10 and 11. Components and functions corresponding to those which have already been explained above with reference to FIGS. 1 to 9, and in particular with reference to FIGS. 7 to 9, are denoted by the same reference signs and are not discussed in detail again.

Instead of an elongate connecting lever 29 as in the embodiment from FIGS. 7 to 9, the torque compensation weight element 31 has a disc-shaped connecting lever 32. A central region 33 of the connecting lever 32 is connected to the main body 18 via the additional element (interface) 30. The compensation weight 28 can be displaced in two dimensions on the upper side of the connecting lever 32 facing away from the additional element 30, as indicated in FIG. 10 by two crossed double-headed arrows in the region of the compensation weight 28. By way of this displacement with two degrees of translational freedom, it is possible to predetermine both the absolute value and the direction of introduction of the torque of the torque compensation weight element 31 in an adjustable manner. A pivotability or rotatability of the connecting lever 32 is not necessary in this embodiment, although it is possible in principle.

Figure 12:
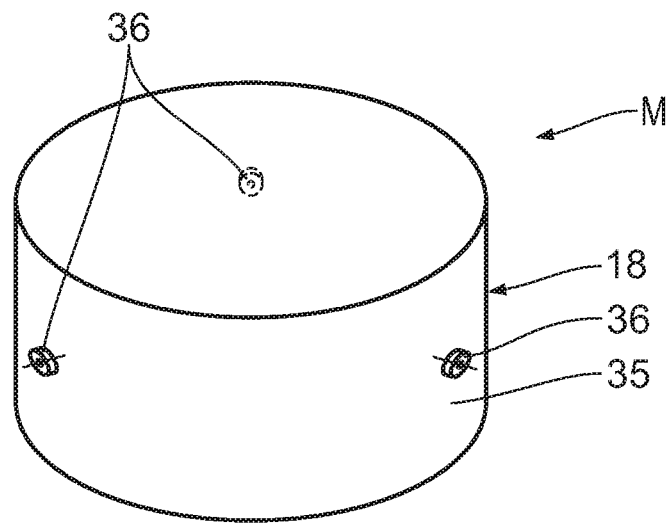
FIG. 12 shows a perspective view of a further embodiment of a main body of a mirror as a further example for an optical element with compensation weight elements attached to the edge of the optical element.

FIG. 12 shows a further embodiment of a main body 18 of a mirror M, which can be used within the projection exposure apparatus 1 instead of the mirror M according to FIG. 4, for example. Components and functions corresponding to those which were already explained above with reference to FIGS. 1 to 11 are denoted by the same reference signs and are not discussed in detail again.

The main body 18 of the mirror M according to FIG. 12 has a plurality of compensation weight elements 36, a total of three in the illustrated embodiment, which are attached to the main body 18 via interface units 37 in each case, on the edge side, i.e., on a lateral wall 35 of the main body 18. One of the three compensation weight elements 36 is covered by the main body 18 and therefore illustrated by dashed lines in FIG. 12. The three compensation weight elements 36 of the embodiment according to FIG. 12 can be arranged about the main body 18 with an equal distribution about the circumferential direction. Depending on the embodiment, a different number of compensation weight elements 36 can also be arranged at the main body 18 on the edge. Here, the number of compensation weight elements 36 can lie between 1 and 12, for example.

Figure 13:
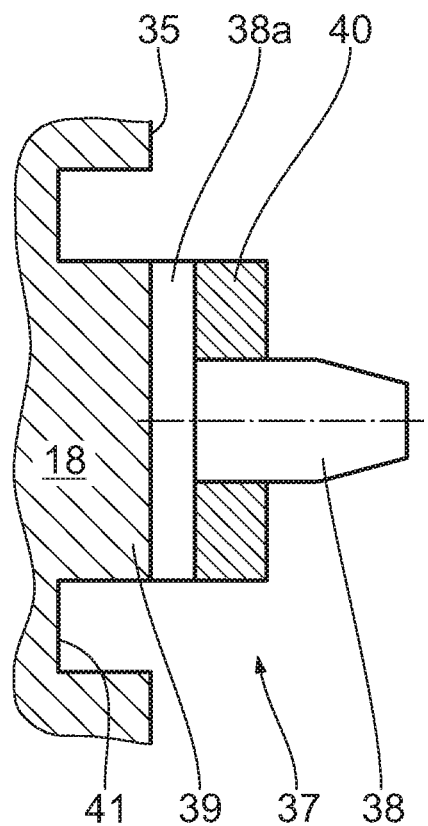
FIG. 13 shows, in comparison with FIG. 12, a magnified section of an axial section through the main body according to FIG. 12 in the region of an interface unit for attaching/fixing a compensation weight element.
Figure 14:
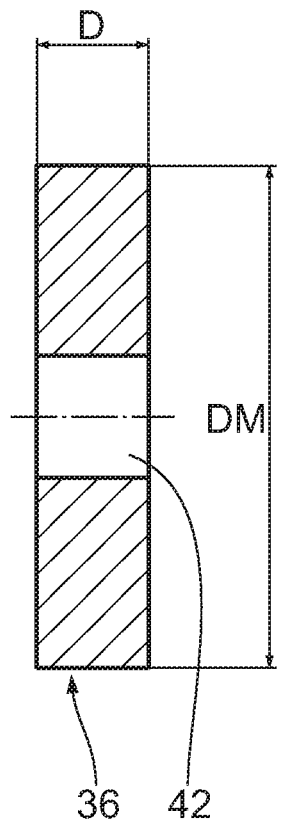
FIG. 14 shows a compensation weight element that is attachable to the edge, which is attachable to the interface unit according to FIG. 13.

FIG. 13 shows details of one of the interface units 37 and FIG. 14 shows the compensation weight element 36 in an axial section prior to the attachment to the interface unit 37.

The interface unit 37 has a pin 38, the base plate portion 38a of which is connected to an interface lateral section 39 of the main body 18. In the embodiment according to FIG. 13, the base plate portion 38a of the pin 38 is connected to the main body 18 in an integrally bonded manner by way of an adhesive layer.

The pin 38 represents a holding component for the compensation weight element 36.

The pin 38 carries at least one magnet 40. Here, as illustrated, once again, in an axial section in FIG. 13, this can be a magnetic ring, which is plugged onto the pin 38 as far as an abutment on the base plate portion 38a. A diameter of the base plate portion 38a can have the same size as an external diameter of the magnetic ring. Additionally, the magnet 40 can be once again connected to the pin 38 in an integrally bonded manner and/or by way of a press fit.

In the circumferential direction about the interface lateral wall portion 39, at least one decoupling recess 41 is provided in the lateral wall 35 of the main body 18, wherein the decoupling recess can be a decoupling groove and, in particular, a decoupling annular groove. The decoupling recess 41 serves to prevent unwanted tension-induced surface deformations of the optical element M.

The compensation weight element 36 is embodied as a ring which is plugged onto a free end of the pin 38 via its ring opening 42. In order to simplify this plugging process, the free end of the pin 38 can taper, as illustrated in FIG. 13. The compensation weight element 36 is made from a magnetic material, for example Invar®.

The compensation weight element 36 has a thickness D and a diameter DM.

The compensation weight element 36 can be a constituent part of a set of various compensation weight elements. Compensation weight elements of this set can differ in terms of diameter DM, but all have the same thickness D. The compensation weight elements of the set all have the same, homogeneous density.

Figure 15:
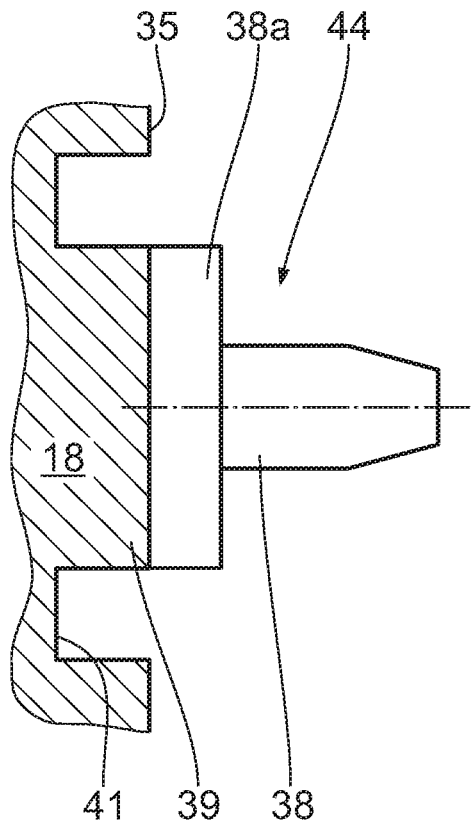
FIGS. 15 and 16 show, in illustrations similar to FIGS. 13 and 14, a further embodiment of a compensation weight element, attached to a further embodiment of an interface unit of the main body.
Figure 16:
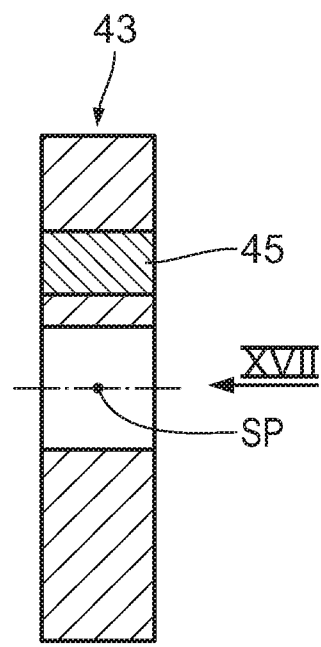

FIGS. 15 and 16 show, in an illustration similar to FIGS. 13 and 14, a further embodiment of an interface unit 44 and a compensation weight element 43. Components and functions which were already explained above with reference to FIGS. 1 to 14, in particular with reference to FIGS. 12 to 14, are denoted by the same reference signs and are not discussed in detail again.

The compensation weight element 43 carries a magnet 45, which interacts with a counter component of the interface unit 44, namely the base plate portion 38a, for fixing the compensation weight element 43 to the interface unit 44. In the case of the interface unit 44, the base plate portion 38a is made of magnetic material, Invar® in the present example embodiment.

The magnet 45 of the compensation weight element 43 can be a magnet portion that is introduced into the compensation weight element 43, which is otherwise embodied as a ring again. The magnet 45 can be adhesively bonded to the other compensation weight element 43 and/or connected to the latter by way of a press fit.

Figure 17:
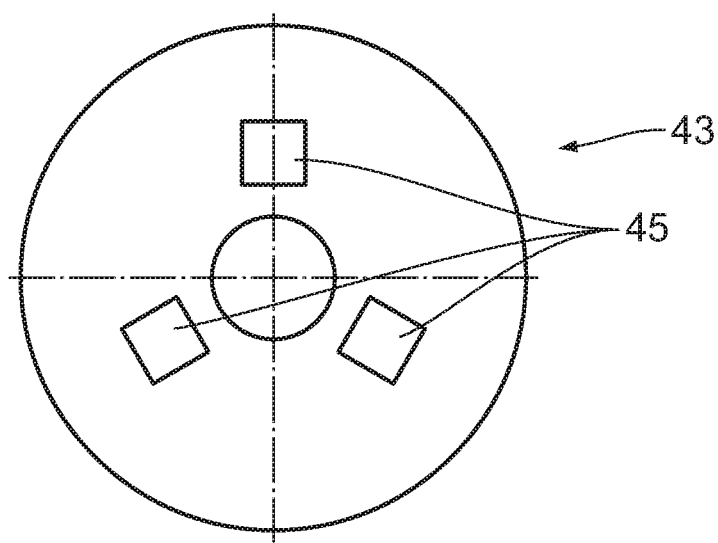
FIG. 17 shows a plan view of the compensation weight element according to FIG. 16, as seen from the viewing direction XVII in FIG. 16.

FIG. 17 shows a plan view of the compensation weight element 43 from the viewing direction XVII in FIG. 16. The illustrated embodiment of the compensation weight element 43 has three magnets 45 that the arranged with equal distribution in the circumferential direction about the ring-shaped main body. This provides a secure magnetic connection between the compensation weight element 43 and the base plate portion 38a of the interface unit 44 that has multiple rotational symmetries in respect of the force introduction.

Like the other compensation weight elements described above, too, the compensation weight element 43 also can be a constituent part of a set of different compensation weight elements. Once again, the compensation weight elements of such set only differ in terms of their diameter. An axial extent of the magnets 45 is just as large as the axial extent, i.e., the thickness, of the ring-shaped main body of the compensation weight element 43.

Figure 18:
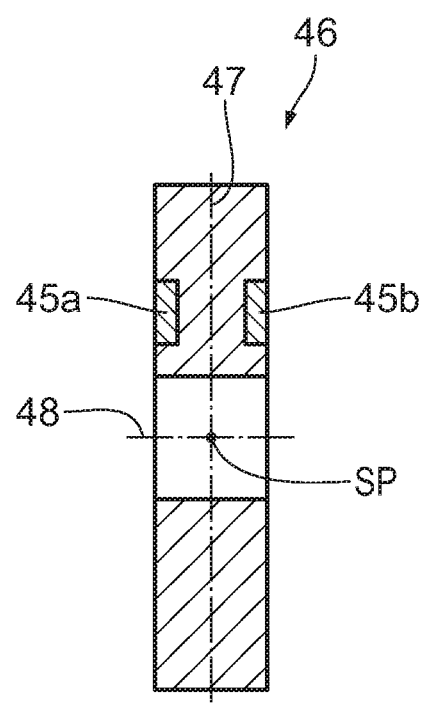
FIG. 18 shows, in an illustration similar to FIG. 16, a further embodiment of a compensation weight element.

In an illustration similar to FIG. 16, FIG. 18 shows a further embodiment of a compensation weight element 46, which can be used in place of the compensation weight element 43, for example. Components and functions corresponding to those which have already been explained above with reference to FIGS. 1 to 17, and in particular in conjunction with FIG. 16, are denoted by the same reference signs and are not discussed in detail again.

In the compensation weight element 46, the magnet 45 has a two-part embodiment with magnetic portions 45a, 45b. The two magnetic portions 45a, 45b are arranged on both sides of the main body of the compensation weight element 46. The magnetic portions 45a, 45b are arranged with mirror symmetry in relation to a mid ring plane 47 of the main body of the compensation weight element 46. A ring axis 48 is perpendicular to the mid ring plane 47. The point of intersection between the ring axis 48 and the mid ring plane 47 simultaneously is the center of mass SP of the compensation weight element 46.

In the arrangement variants of the magnets 45 according to FIGS. 16 and 18, a central position of the center of mass SP is maintained, independently of the diameter of the respective compensation weight element 43, 46. In particular, a relative position of the center of mass SP in relation to an abutment surface of the interface unit 44 facing the respective compensation weight element 43, 46 is maintained independently of the compensation weight element diameter.

The main body 18 of the optical element, i.e., for example of the mirror M, can be manufactured from ULE®.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. An optical element, comprising:
a main body;
an optical surface supported by the main body;
a compensation weight element supported by the main body, the compensation weight element comprising a compensation weight; and
a lever connecting the compensation weight to the main body in a connection region so that a direction of a gravitational force of the compensation weight, proceeding from a center of mass thereof, extends a distance from the connection region,
wherein:
the lever has an adjustable length, and/or the lever has an adjustable direction; and
the compensation weight element is configured to compensate a figure deformation of the optical surface caused by gravity.

2. The optical element of claim 1, wherein the optical element comprises a mirror, and the compensation weight element is supported by a side of the main body that faces away from the optical surface.

3. The optical element of claim 2, wherein the compensation weight element is supported by an edge of the main body.

4. The optical element of claim 1, wherein the optical element comprises a mirror, and the compensation weight element is supported by an edge of the main body.

5. The optical element of claim 1, wherein the compensation weight element is supported by the main body in a region of a center-of-mass axis of the optical element.

6. The optical element of claim 1, further comprising a plurality of bearing sites configured so that the optical element is bearable in a bearing receptacle via the plurality of bearing sites, wherein the compensation weight element is between two bearing sites that are adjacent each other in a circumferential direction of the optical element.

7. The optical element of claim 6, further comprising a plurality of compensation weight elements, wherein respectively one compensation weight element is arranged between all bearing sites that are adjacent to one another in the circumferential direction.

8. The optical element of claim 1, wherein the compensation weight element is supported by the main body in an interlocking manner.

9. The optical element of claim 1, wherein the compensation weight element is supported by the main body in an integrally bonded manner.

10. The optical element of claim 1, wherein the lever has an adjustable length.

11. The optical element of claim 1, further comprising an additional element connecting the compensation weight element to the main body.

12. The optical element of claim 1, further comprising a plurality of compensation weight elements, wherein each compensation weight element is configured compensate a figure deformation of the optical surface caused by gravity.

13. The optical element of claim 12, wherein:
the optical element comprises a mirror; and
at least one of the following holds:
   at least one of the plurality of compensation weight elements is supported by a side of the main body that faces away from the optical surface; and
   at least one of the plurality of compensation weight elements is supported by an edge of the main body.

14. The optical element of claim 12, wherein at least one of the compensation weight elements is supported by the main body in a region of a center-of-mass axis of the optical element.

15. An imaging optical unit, comprising:
an optical element according to claim 1,
wherein the imaging optical unit is configured to image an object field into an image field.

16. An optical system, comprising:
an illumination optical unit configured to illuminate an object field; and
an imaging optical unit configured to image an object field into an image field,
wherein the imaging optical unit comprises an optical element according to claim 1.

17. A projection exposure apparatus, comprising:
a light source configured to produce illumination light;
an illumination optical unit configured to illuminate an object field with the illumination light; and
an imaging optical unit configured to image an object field into an image field,
wherein the imaging optical unit comprises an optical element according to claim 1.

18. A method of using a projection exposure apparatus comprising an illumination optical unit and an imaging optical unit, the method comprising:
using the illumination optical unit configured to illuminate an object in an object field; and
using the imaging optical unit configured to image an object field into an image field,
wherein the imaging optical unit comprises an optical element according to claim 1.

19. The optical element of claim 1, wherein the lever has an adjustable direction.

20. A method, comprising:
producing a blank of an optical element taking account of a negative deformation allowance so that the optical element has a desired figure only under a gravitational force of at least one compensation weight;
transporting the blank to a use location of an apparatus for projection lithography; and
attaching the at least one compensation weight element to a main body of the optical element taking account of a gravitational acceleration at the use location for weight compensation of a figure deformation of an optical surface of the optical element caused by gravity,
wherein attaching the at least one compensation weight element to the main body of the optical element comprises:
   a) attaching at least one raw compensation weight element to the main body of the optical element, the at least one raw compensation weight element being designed to overcompensate an expected effect of gravity on the figure deformation of the optical surface of the optical element and
   b) after a), removing part of the at least one raw compensation weight element to reduce its weight to achieve a desired figure deformation of the optical surface of the optical element.

21. The method of claim 20, wherein the method results in the optical surface of the optical element having a deformation from a theoretical best fit which is less than 350 pm.

22. The method of claim 20, wherein the method results in the optical surface of the optical element having a deformation from a theoretical best fit which is approximately 13 pm.

* * * * *

UNITED STATES PATENT AND TRADEMARK OFFICE
CERTIFICATE OF CORRECTION

| | | |
|---|---|---|
| PATENT NO. | : 11,029,606 B2 | Page 1 of 1 |
| APPLICATION NO. | : 16/735883 | |
| DATED | : June 8, 2021 | |
| INVENTOR(S) | : Prochnau et al. | |

It is certified that error appears in the above-identified patent and that said Letters Patent is hereby corrected as shown below:

On the Title Page

Item (56), Column 2 (Foreign Patent Documents), Line 2, delete "10 2012 214 214" and insert -- 10 2012 214 232 --;

In the Specification

Column 1, Line 9, after "application" insert -- No. --;

Column 3, Line 60, delete "herein" and insert -- herein. --;

Column 4, Line 22, delete "centerd" and insert -- centered --;

Column 8, Line 14, delete "$c_y=1/R_y$ y" and insert -- $c_y=1/R_y$ --;

In the Claims

Column 16, Line 29, Claim 20, delete "element" and insert -- element; --.

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*